(12) United States Patent
Chen et al.

(10) Patent No.: US 12,429,175 B2
(45) Date of Patent: Sep. 30, 2025

(54) LIGHTING APPARATUS

(71) Applicant: LEEDARSON LIGHTING CO., LTD., Fujian (CN)

(72) Inventors: Huiwu Chen, Fujian (CN); Xiaobo Chen, Fujian (CN); Hao Chen, Fujian (CN)

(73) Assignee: LEEDARSON LIGHTING CO., LTD., Zhangzhou (CN)

( * ) Notice: Subject to any disclaimer, the term of this patent is extended or adjusted under 35 U.S.C. 154(b) by 0 days.

(21) Appl. No.: 18/671,111

(22) Filed: May 22, 2024

(65) Prior Publication Data

US 2025/0172255 A1    May 29, 2025

(30) Foreign Application Priority Data

Nov. 27, 2023   (CN) .......................... 202323226036.5

(51) Int. Cl.
| | |
|---|---|
| F21K 9/232 | (2016.01) |
| F21K 9/237 | (2016.01) |
| F21K 9/64 | (2016.01) |
| F21K 9/68 | (2016.01) |
| F21K 9/69 | (2016.01) |
| F21Y 103/10 | (2016.01) |
| F21Y 113/17 | (2016.01) |
| F21Y 115/10 | (2016.01) |

(52) U.S. Cl.
CPC .............. *F21K 9/232* (2016.08); *F21K 9/237* (2016.08); *F21K 9/64* (2016.08); *F21K 9/68* (2016.08); *F21K 9/69* (2016.08); *F21Y 2103/10* (2016.08); *F21Y 2113/17* (2016.08); *F21Y 2115/10* (2016.08)

(58) Field of Classification Search
CPC . F21K 9/232; F21K 9/237; F21K 9/64; F21K 9/68; F21K 9/69; F21Y 2103/10; F21Y 2113/17; F21Y 2115/10
See application file for complete search history.

(56) References Cited

U.S. PATENT DOCUMENTS

2015/0228629 A1* 8/2015 Tsai ................... H01L 25/0753 257/89
2022/0364691 A1* 11/2022 Bukkems ................. F21S 4/24

FOREIGN PATENT DOCUMENTS

CN          217928340 U   * 11/2022
WO    WO-2022258591 A1 * 12/2022

OTHER PUBLICATIONS

Machine translation of CN 217928340 U (Year: 2022).*

\* cited by examiner

*Primary Examiner* — James R Greece
*Assistant Examiner* — Jose M Diaz
(74) *Attorney, Agent, or Firm* — LANWAY IPR SERVICES; Chun-Ming Shih (57) ABSTRACT

A lighting apparatus includes a base plate, multiple first type LED chips, multiple second type LED chips, a first fluorescent layer and a second fluorescent layer. The first fluorescent layer only covers the first type LED chips. The second fluorescent layer covers both the first type LED chips and the second type LED chips. The first type LED chips integrated with the first fluorescent layer emit a first light. The second type LED chips integrated with the first fluorescent layer and the second fluorescent layer emit a second light. The first light and the second light have more than 30% overlapping.

19 Claims, 10 Drawing Sheets

LIGHTING APPARATUS

FIELD

The present invention is related to a lighting apparatus, and more particularly related to a lighting apparatus with an enhanced light pattern.

BACKGROUND

Light Emitting Diodes (LEDs) have experienced significant advancements over the past few decades, revolutionizing the lighting industry. Initially used as indicator lights in electronic devices, LEDs have evolved into highly efficient and versatile light sources. The development of high-brightness LEDs and improvements in manufacturing processes have made LEDs a viable option for a broad range of lighting applications.

One of the key advantages of LED technology is its superior energy efficiency compared to traditional incandescent and fluorescent lighting. LEDs convert a higher percentage of electrical energy into light, resulting in lower power consumption and reduced energy costs. This efficiency, combined with a longer operational lifespan, has led to widespread adoption in residential, commercial, and industrial lighting.

The versatility of LEDs also plays a crucial role in their rapid and widespread use. LEDs are available in various colors and can be easily controlled for brightness and color temperature, making them ideal for a wide range of lighting designs and applications. From architectural lighting and street lighting to automotive headlights and display screens, LEDs provide reliable and customizable lighting solutions.

Moreover, the compact size and durability of LEDs contribute to their popularity. Unlike traditional lighting technologies, LEDs are solid-state devices, making them more resistant to shock, vibration, and extreme temperatures. This robustness allows LEDs to be used in environments and applications where traditional lighting might fail, such as outdoor and automotive settings.

Recent developments in LED technology have also focused on improving light quality and reducing manufacturing costs. Advances in materials and semiconductor technology have led to LEDs with higher luminous efficacy and better color rendering index (CRI). These improvements ensure that LED lighting not only saves energy but also provides high-quality illumination that meets the demands of various applications.

The environmental benefits of LED lighting are significant as well. LEDs do not contain harmful substances such as mercury, which is found in fluorescent lamps, and they produce lower amounts of ultraviolet (UV) and infrared (IR) radiation. Additionally, the longer lifespan of LEDs reduces waste and the need for frequent replacements, contributing to sustainability and environmental conservation efforts.

Overall, the continuous advancements in LED technology have positioned LEDs as a leading solution in the lighting industry. Their energy efficiency, versatility, durability, and environmental benefits make LEDs an attractive choice for a wide range of lighting applications, driving their rapid and widespread adoption in recent years. As research and development in this field continue, it is expected that LED technology will further revolutionize lighting and contribute to more sustainable and efficient lighting solutions worldwide.

Phosphor materials play a crucial role in the functionality of LEDs, particularly in generating light with specific parameters such as color temperature and brightness. In white LEDs, a blue LED chip is typically coated with a phosphor layer that converts some of the emitted blue light into other colors. This process, known as phosphor conversion, allows for the production of white light by combining the blue light with the converted light, which is usually yellow or a combination of red and green, depending on the phosphor composition.

The choice of phosphor material is essential in determining the quality and characteristics of the emitted light. Different phosphor compounds can produce various wavelengths of light, enabling the fine-tuning of color temperature and color rendering index (CRI). For instance, a blend of yttrium aluminum garnet (YAG) doped with cerium is commonly used to convert blue light to yellow, which, when mixed with the residual blue light, creates a cool white light. Alternatively, combining blue light with red and green phosphors can produce warm white light, suitable for indoor and residential lighting.

The phosphor layer's thickness and particle size distribution are carefully controlled to achieve the desired light output and efficiency. A uniform phosphor layer ensures consistent light conversion and minimizes color variation across the LED. Advanced manufacturing techniques, such as remote phosphor technology, where the phosphor layer is placed at a distance from the LED chip, can further enhance light uniformity and reduce thermal quenching effects, improving the overall performance and lifespan of the LED.

Phosphor-converted LEDs offer several advantages, including high luminous efficacy and the ability to produce a broad spectrum of light, which is crucial for applications requiring high color accuracy and quality. By selecting appropriate phosphor materials and optimizing their application, manufacturers can design LEDs that meet specific lighting requirements, from high-intensity outdoor lighting to energy-efficient indoor illumination.

Furthermore, ongoing research and development in phosphor technology continue to push the boundaries of LED performance. Innovations such as narrow-band red phosphors have led to LEDs with higher CRI and better color quality, making them suitable for applications in retail, healthcare, and art galleries where accurate color representation is critical. These advancements in phosphor materials contribute to the versatility and adoption of LED technology across various sectors.

Overall, the integration of phosphor materials in LEDs is a sophisticated process that significantly impacts the light quality and efficiency of the final product. Through careful selection and application of these materials, LEDs can be tailored to produce light with precise parameters, ensuring they meet the diverse needs of modern lighting applications. As phosphor technology continues to evolve, it will further enhance the capabilities and applications of LED lighting, solidifying its position as a leading solution in the lighting industry.

Designing a better arrangement of light sources is crucial for enhancing flexibility and convenience in developing innovative lighting devices. An optimized layout allows for greater control over light distribution, intensity, and directionality, which are essential for creating customized lighting solutions tailored to specific environments and applications. By strategically arranging light sources, designers can achieve uniform illumination, reduce glare, and enhance the aesthetic appeal of the space, all while maintaining energy efficiency and functionality.

Improved light source arrangements also offer significant benefits in terms of adaptability and scalability. Flexible lighting designs enable seamless integration into various architectural settings, from residential and commercial spaces to public infrastructure and artistic installations. This adaptability is particularly important as the demand for smart lighting solutions grows, requiring systems that can be easily adjusted or expanded to accommodate changing needs and preferences. Additionally, innovative arrangements can simplify the installation and maintenance processes, reducing costs and improving the overall user experience.

Furthermore, a well-thought-out light source arrangement can drive innovation in lighting device design by unlocking new possibilities for creativity and performance. Advanced configurations, such as modular or dynamic lighting systems, allow for interactive and responsive lighting solutions that can transform spaces and enhance user engagement. For instance, tunable white lighting and RGB LED systems can create dynamic atmospheres that adjust to different activities and moods. By focusing on better light source arrangements, designers can push the boundaries of traditional lighting, delivering cutting-edge solutions that meet the evolving demands of modern consumers and industries.

SUMMARY

In some embodiments, a lighting apparatus includes a base plate, multiple first type LED chips, multiple second type LED chips, a first fluorescent layer and a second fluorescent layer.

The first fluorescent layer only covers the first type LED chips.

The second fluorescent layer covers both the first type LED chips and the second type LED chips.

The first type LED chips integrated with the first fluorescent layer and the second fluorescent layer emit a first light.

The second type LED chips integrated with the second fluorescent layer emit a second light.

The first light and the second light has more than 30% overlapping.

In some embodiments, the first fluorescent layer engages the first type LED chips. The second fluorescent layer covers the first fluorescent layer so that the first fluorescent layer is between the first type LED chips and the second fluorescent layer.

In some embodiments, a first surface region of the second fluorescent layer above the first type LED chips is taller than a second surface region of the second fluorescent layer above the second type LED chips.

In some embodiments, a first surface region of the second fluorescent layer above the first type LED chips has the same height as a second surface region of the second fluorescent layer above the second type LED chips.

In some embodiments, a wall structure surrounds each of the first type LED chips for filling the first fluorescent layer to cover the first type LED chips.

In some embodiments, there is reflecting surface on the surrounding wall.

In some embodiments, the first fluorescent layer includes yellow-green phosphor.

In some embodiments, the second fluorescent layer includes red phosphor.

In some embodiments, the first type LED chips and the second type LED chips are arranged on the substrate in an interleaved pattern.

In some embodiments, the substrate is a flexible substrate.

In some embodiments, the substrate is a transparent substrate that allows more than 20% of light to pass through.

In some embodiments, there is a curvature surface on a top surface of the first fluorescent layer to guide the first light and the second light.

In some embodiments, the curvature surface is a convex surface to condense the first light and the second light.

In some embodiments, the curvature surface is a concave surface to diffuse the first light and the second light.

In some embodiments, there are multiple recessed areas.

In some embodiments, the concentration of phosphor material of the second fluorescent layer is larger on a bottom side near the second LED chips than a top side away from from the second LED chips.

In some embodiments, the lighting apparatus may also include a third fluorescent layer attached on a back side of the substrate.

The first type LED chips and the second type LED chips are mounted on a front side of the substrate.

The front side and the back side are opposite of the substrates.

In some embodiments, the lighting apparatus may also include a driver coupled to a manual switch to receive a configuration indicator corresponding to the first type LED chips, the second type LED chips, the first fluorescent layer and the second fluorescent layer to determine driving currents corresponding to the first type LED chips and the second type LED chips.

In some embodiments, the first fluorescent layer has multiple fluorescent parts.

There are gaps between adjacent fluorescent parts for the substrate to bend.

In some embodiments, the first type LED chips are coupled on a first conductive path.

The second type LED chips are coupled on a second conductive path.

A driver respectively transmits a first driving current to the first conductive path and a transmits a second driving current to the second conductive path.

A ratio of the first driving current and the second driving current is adjustable to mix a required color temperature.

DETAILED DESCRIPTION

Figure 3:
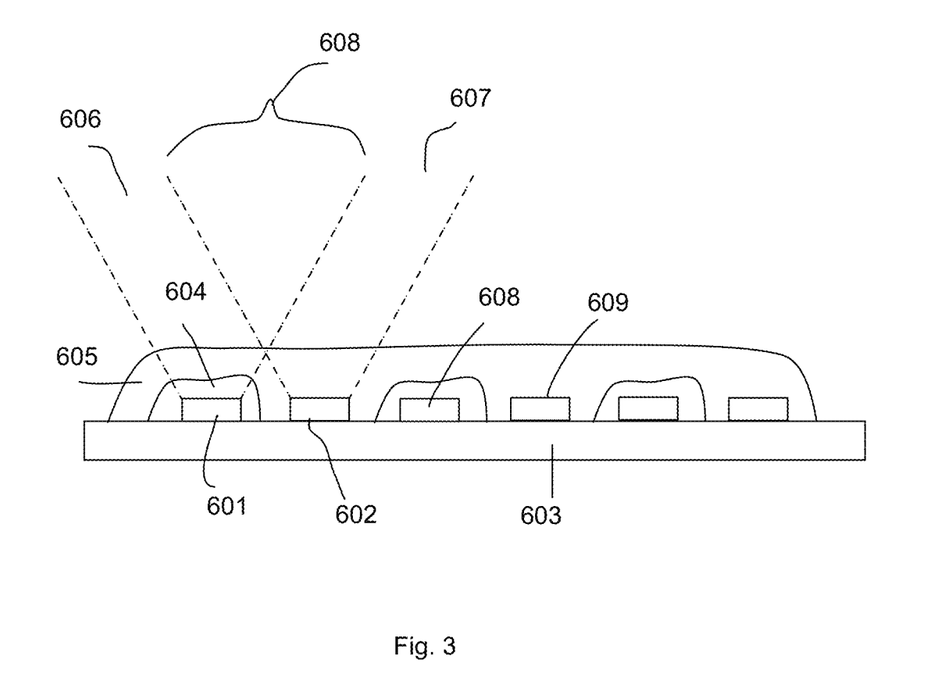
FIG. 3 shows another lighting apparatus embodiment.

In FIG. 3, a lighting apparatus includes a base plate 603, multiple first type LED chips 601, 608, multiple second type LED chips 602, 609, a first fluorescent layer 604 and a second fluorescent layer 605.

The first fluorescent layer 604 only covers the first type LED chips 601, 608.

The second fluorescent layer 605 covers both the first type LED chips 601 and the second type LED chips 602.

The first type LED chips 601 integrated with the first fluorescent layer 604 and the second fluorescent layer 605 emit a first light 606.

The second type LED chips 602 integrated with the first fluorescent layer 604 and the second fluorescent layer emit a second light 607.

The first light 606 and the second light 607 has more than 30% overlapping, as shown in the overlapped area 608.

As known, it is common there is a spanning angles for a LED chip, which may be 180 degrees within the scope, more 70% of light are distributed.

In some embodiments, the first fluorescent layer 604 engages the first type LED chips. The second fluorescent layer 605 covers the first fluorescent layer 604 so that the first fluorescent layer 604 is between the first type LED chips 601 and the second fluorescent layer 605.

In some embodiments, a first surface region of the second fluorescent layer above the first type LED chips is taller than a second surface region of the second fluorescent layer above the second type LED chips.

In some embodiments, a first surface region of the second fluorescent layer above the first type LED chips has the same height as a second surface region of the second fluorescent layer above the second type LED chips.

Figure 4:
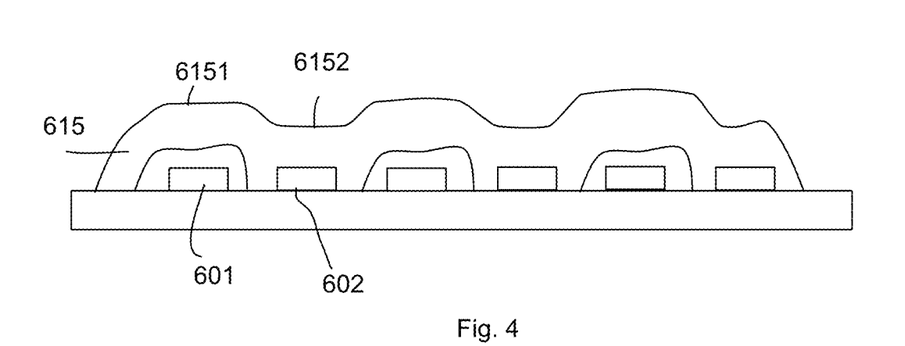
FIG. 4 shows a non-even surface of fluorescent layer.

FIG. 4 shows a different setting for the top surface of the second fluorescent layer 615 compared with the arrangement of FIG. 3.

In FIG. 4, there is a first surface region 6151 above the first type LED chip 601. There is a second surface region 6152 above the second type LED chip 602. The first surface region 6151 is taller than the second surface region 6152.

In contrast, FIG. 3 show the first surface region above first type LED chip has similar or substantially same height as the second surface above second type LED chip.

In FIG. 4, a wall structure 624 surrounds each of the first type LED chips 620 for filling the first fluorescent layer 621 to cover the first type LED chips 620. The second fluorescent layer 622 is stacked above the first fluorescent layer 621.

In some embodiments, there is reflecting surface on the surrounding wall.

Figure 5:
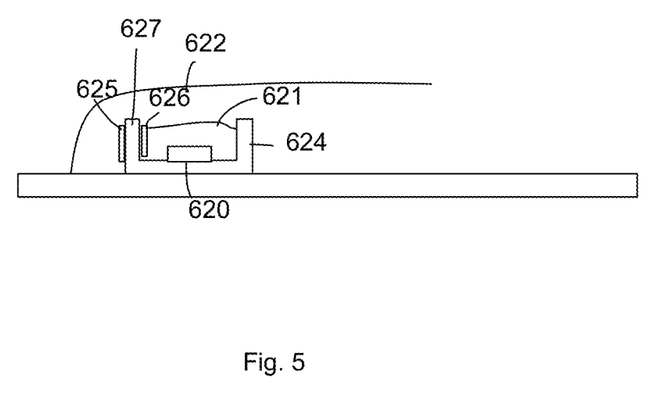
FIG. 5 shows an arrangement of surrounding wall to hold phosphor material.

In FIG. 5, there are two reflecting surfaces 625, 626 attached on surfaces of the surrounding wall 627 of the wall structure 624.

The reflective surfaces 625, 626 enhances light performance by reflecting lights from the first type LED chip and the second type LED chip.

In some embodiments, the first fluorescent layer includes yellow-green phosphor.

In some embodiments, the second fluorescent layer includes red phosphor.

In some embodiments, the first type LED chips and the second type LED chips are arranged on the substrate in an interleaved pattern.

Figure 6:
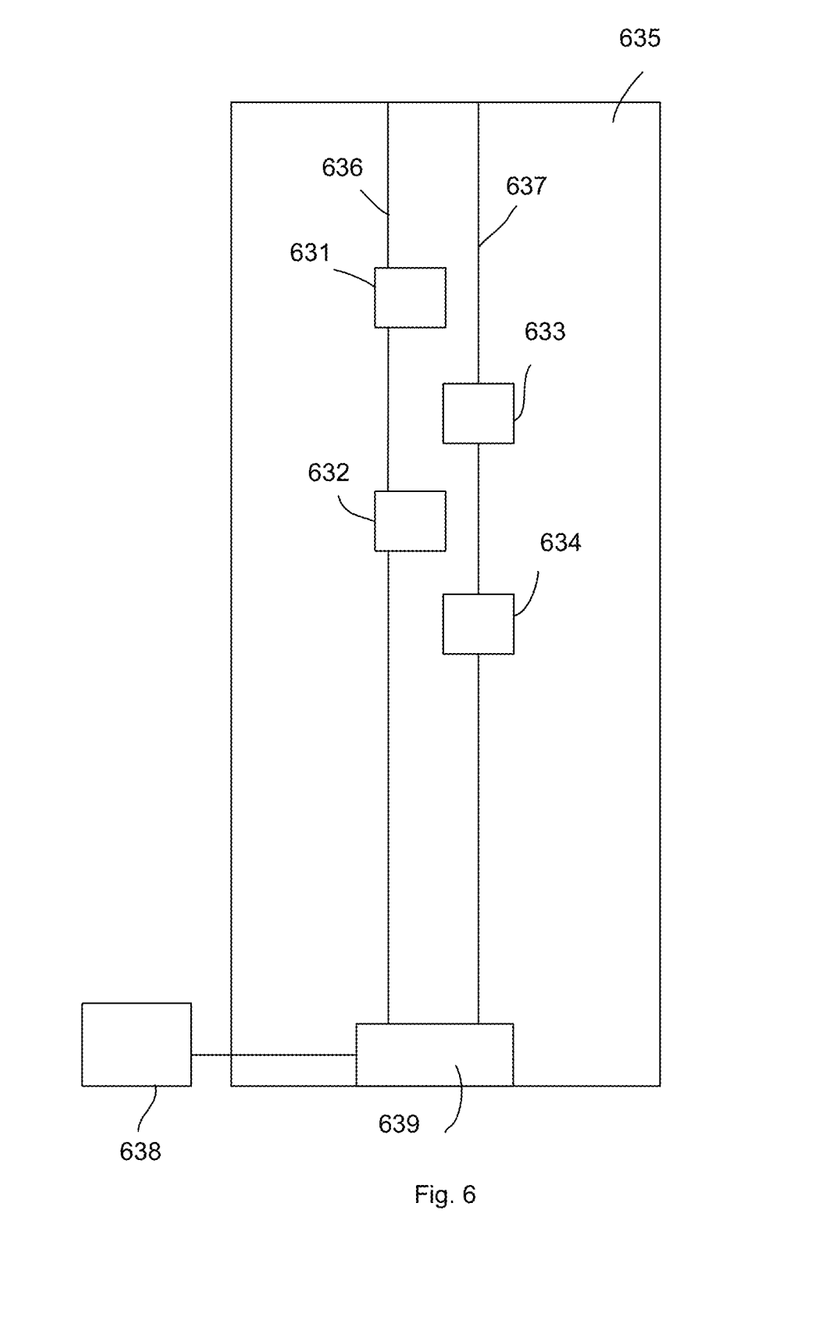
FIG. 6 shows an example to arrange LED chips in interleaved pattern.

FIG. 6 illustrates first type LED chips 631, 632 are connected in series on a first conductive path 636. Second type LED chips 633, 634 are connected in series on a second conductive path 637.

The base plate 635 is for mounting the first type LED chips 631, 632, and the second type LED chips 633,634.

In some embodiments, the base plate 635 is a flexible plate.

In some embodiments, the substrate is a transparent substrate that allows more than 20% of light to pass through.

Figure 7:
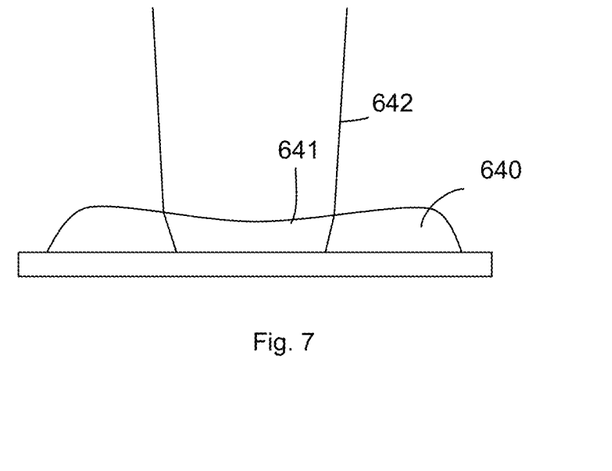
FIG. 7 shows one arrangement to change light direction.

In FIG. 7, there is a curvature surface 641 on a top surface of the second fluorescent layer 640 to guide the first light and the second light to desired light span.

In FIG. 7, the curvature surface is a convex surface 641 to condense the first light and the second light. The light spanning line 642 shows such manner.

Figure 8:
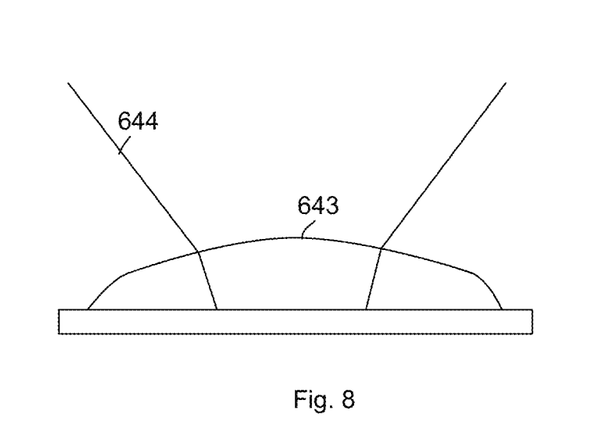
FIG. 8 shows another arrangement to change light direction.

In FIG. 8, the curvature surface 643 is a concave surface to diffuse the first light and the second light. The light spanning line 644 shows such manner.

Figure 9:
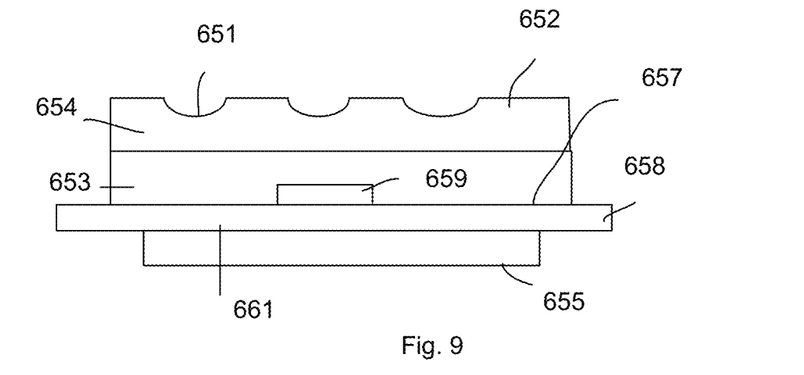
FIG. 9 shows a side view for illustrating how to make modification to enhance overall light effect

FIG. 9 shows another embodiment. In FIG. 9, there are multiple recessed areas 651 on the surface of the second fluorescent layer. Preferably, the diameter of each recessed areas 651 is smaller than 1 mm.

In some embodiments, the concentration of phosphor material of the second fluorescent layer is larger on a bottom side near the second LED chips than a top side away from the second LED chips.

FIG. 9 shows a second fluorescent layer that has a bottom part 653 closer to the LED chip 659. A top part 654 of the second fluorescent layer is stacked above the bottom part 653. The centration of phosphor material of the top part 654 is smaller than the bottom part 653. It is found that such arrangement makes the light conversion more effectively.

In some embodiments, the lighting apparatus may also include a third fluorescent layer attached on a back side of the substrate.

In FIG. 9, there is a base plate 658 for mounting the LED chip 659 and the second fluorescent layer on a front side 657. A third fluorescent layer 655 is attached to the back side 661 of the substrate plate 658.

The first type LED chips and the second type LED chips are mounted on a front side of the substrate.

The front side and the back side are opposite of the substrates.

In some embodiments, the lighting apparatus may also include a driver coupled to a manual switch to receive a configuration indicator corresponding to the first type LED chips, the second type LED chips, the first fluorescent layer and the second fluorescent layer to determine driving currents corresponding to the first type LED chips and the second type LED chips.

FIG. 6 shows a driver 639 coupled to a manual switch 638. The manual switch 638 may be a pin-based configuration switch, a slider switch or other switch that users may used to configure to set a parameter supplied to the driver 639 so that the driver 639 may be disposed on different arrangement of light sources, e.g. different LED chips, different number of LED chips, different setting of phosphor concentration, thickness and material.

Figure 10:
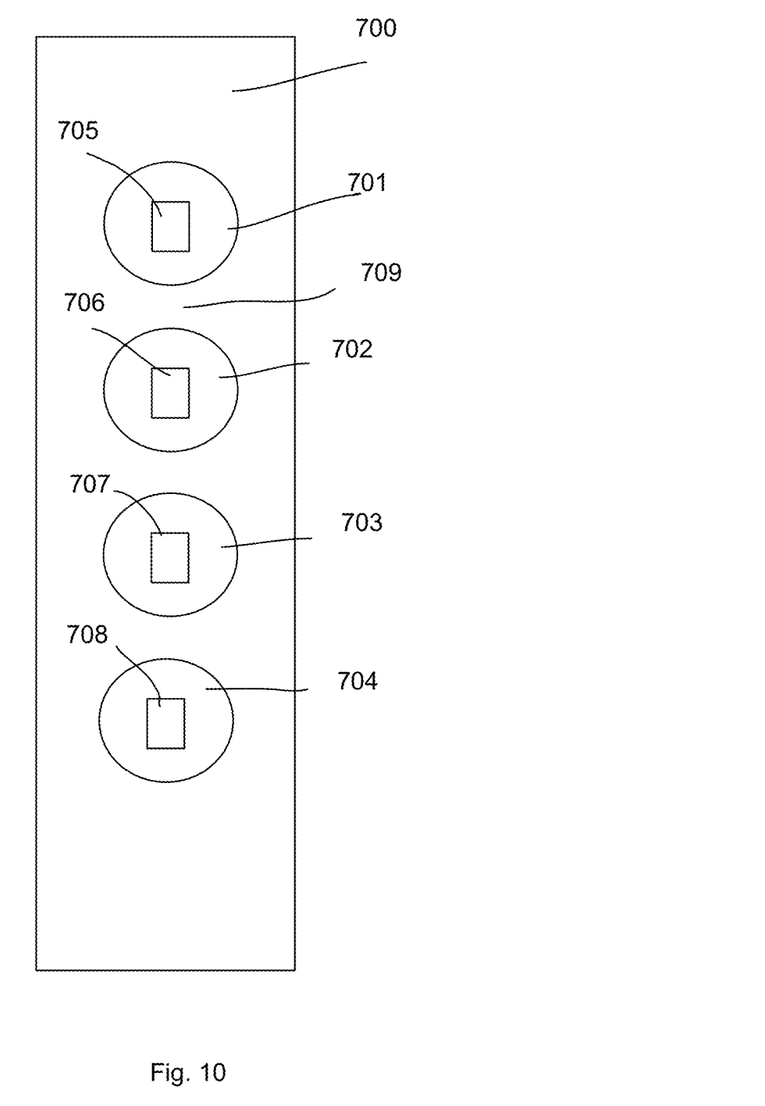
FIG. 10 shows an arrangement of fluorescent parts to make light strip easier to be bent.

In FIG. 10, the second fluorescent layer has multiple fluorescent parts 701, 702, 703, 704. These fluorescent parts 701, 702, 703, 704 each covers LED chips 705, 706, 707, 708 placed on a base plate 700. There are gaps 709 between adjacent fluorescent parts.

There are gaps between adjacent fluorescent parts for the substrate to bend. This is helpful if the base plate is flexible and made as a light strip.

In FIG. 6, the first type LED chips 631, 632 are coupled on a first conductive path 636.

The second type LED chips 633, 634 are coupled on a second conductive path 637.

A driver 639 respectively transmits a first driving current to the first conductive path 636 and a transmits a second driving current 637 to the second conductive path 637.

A ratio of the first driving current and the second driving current is adjustable to mix a required color temperature.

Figure 1:
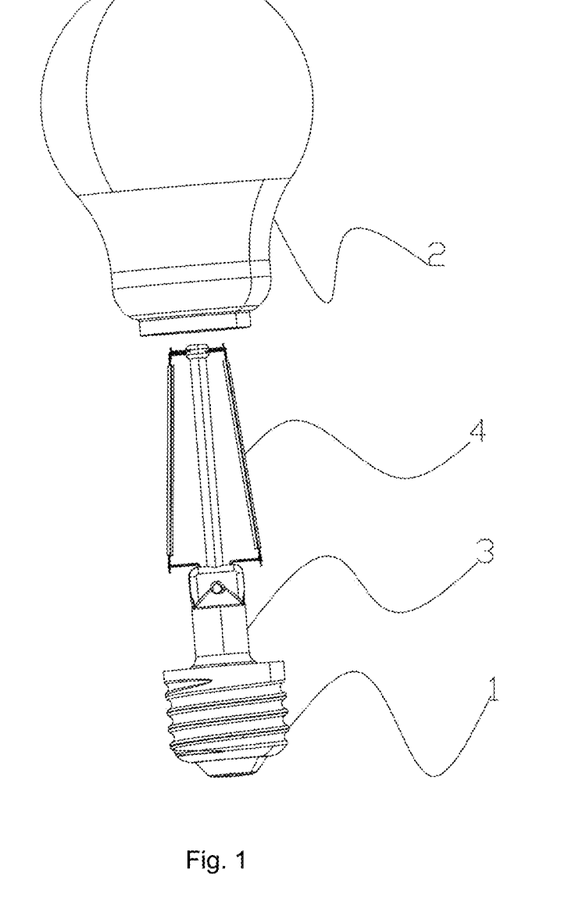
FIG. 1 illustrates a light bulb embodiment.
Figure 2:
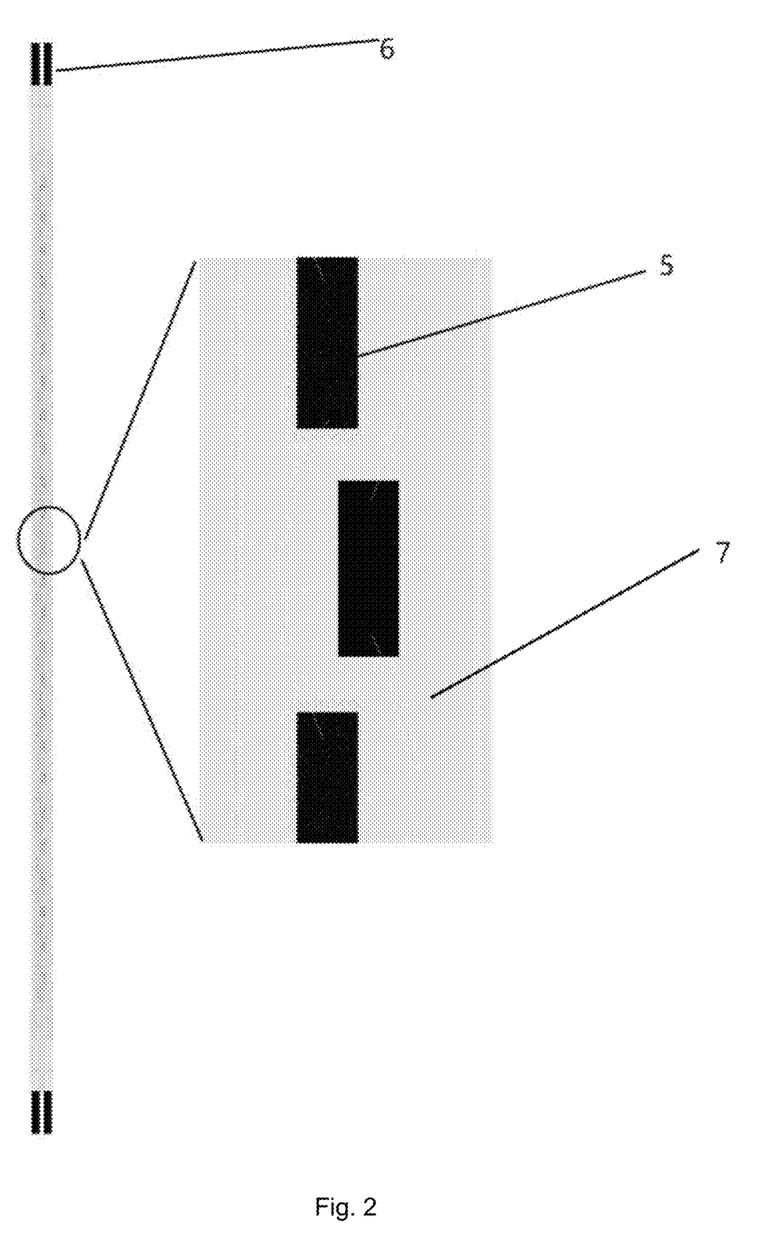
FIG. 2 illustrates a light strip example.

FIG. 1 is a schematic structural diagram of an LED filament according to an embodiment of the present application. FIG. 2 is a schematic structural diagram of a lighting device according to an embodiment of the present application.

Please refer to FIG. 1 and FIG. 2. FIG. 2 is a schematic structural diagram of an LED filament according to an embodiment of the present application. As shown in FIG. 2, an LED filament 4 includes: a circuit substrate 7 and LED chips 5. Multiple rows of LED chips 5 are spaced apart and mounted on one side of the circuit substrate 7. The LED chips 5 in adjacent rows are arranged in a staggered pattern, and each pair of LED chips 5 is connected by bonding wires. The LED chips 5 include high color temperature LED chips and low color temperature LED chips. Both the high color temperature LED chips and the low color temperature LED chips are coated with yellow-green phosphor glue, and the low color temperature LED chips are additionally coated with red phosphor.

More specifically, a layer of red phosphor is first applied to the low color temperature LED chips, and then yellow-green phosphor is applied on top of the red phosphor layer and on the high color temperature LED chips. This approach overcomes and solves the problems of uneven multi-color mixing and excessively wide substrates in linear filaments, enhancing the appearance and color mixing uniformity of filament lamps, thus improving product competitiveness.

Specifically, pins are provided at both ends of the circuit substrate 7 for electrical connection to a power source. The LED chips in the same row are electrically connected in pairs. The circuit substrate 7 is light-transmitting and made of sapphire, ceramic, or plastic materials. The high color temperature LED chips produce a high color temperature spectrum ranging from 3500K to 8000K. The low color temperature LED chips produce a low color temperature spectrum ranging from 1800K to 4500K. The circuit substrate 7 can be a flexible or rigid circuit substrate, with the substrate material being at least partially light-transmitting; flexible circuit substrates are made of materials like polyimide, while rigid substrates are made of materials like sapphire or ceramic.

FIG. 1 is a schematic structural diagram of a lighting device with an LED filament according to an embodiment of the present application. As shown in FIG. 1, the lighting device uses the filament described in the above embodiment. It includes filament 4, bulb shell 2, lamp base 1, and core column 3. Both ends of the filament 4 are welded to the pins of the core column 3, and a driving device is installed inside the lamp base 1. The core column 3 is placed inside the bulb and connected to the bulb shell 2 through sintering.

The filament in this application has the following effects: The high and low color temperature chips are located in the same light-emitting area. A small area of red phosphor is applied exclusively on the low color temperature chips to produce a low color temperature spectrum. This not only saves phosphor material but also ensures that the high color temperature and low color temperature are mixed in the same light-emitting area, resulting in excellent color mixing when both channels are illuminated simultaneously. When only the high color temperature is illuminated, there is no noticeable unlit area in the filament, preserving the visual effect and enhancing the decorative and aesthetic appeal of the filament lamp.

Because the high and low color temperature chips and their light-emitting areas are located in the same region, the substrate width can be effectively reduced. This allows for the creation of thinner filaments while maintaining luminous flux and efficiency, thereby saving substrate and phosphor costs and enhancing the competitiveness of filament lamp products.

Phosphor materials are integral to the process of converting LED chip light into light with desired optical parameters, particularly in generating yellow and green light. These materials work by absorbing part of the light emitted by the LED chip and re-emitting it at different wavelengths. This phosphor conversion process enables the creation of white light or specific color temperatures by combining the emitted blue or UV light from the LED chip with the yellow or green light from the phosphor.

In white LEDs, a blue LED chip is often used in conjunction with a yellow-emitting phosphor, such as cerium-doped yttrium aluminum garnet (YAG:Ce). When the blue light from the LED chip strikes the phosphor, a portion of the light is absorbed and re-emitted as yellow light. The combination of the residual blue light and the converted yellow light results in white light. The exact shade of white light can be controlled by adjusting the composition and thickness of the phosphor layer, allowing for a range of color temperatures from cool white to warm white.

For applications requiring green light, a green-emitting phosphor can be used in conjunction with a blue or UV LED chip. Common green phosphors include silicate-based phosphors doped with elements such as europium or terbium. These phosphors efficiently convert the blue or UV light into green light, providing high luminous efficacy and a stable light output. The resulting green light can be used in various applications, including display technology, horticultural lighting, and specialty lighting.

The integration of both yellow and green phosphors in an LED device allows for more sophisticated light mixing and customization of the light output. By carefully selecting and combining different phosphors, manufacturers can achieve precise control over the color rendering index (CRI) and color temperature of the emitted light. This capability is particularly important in applications such as retail lighting, where accurate color representation is essential, and in architectural lighting, where specific aesthetic effects are desired.

Additionally, the spatial distribution and particle size of the phosphor materials are crucial factors in determining the efficiency and uniformity of the light conversion. A uniform phosphor layer ensures consistent color output and minimizes variations in light intensity. Advanced deposition techniques, such as remote phosphor technology, where the phosphor layer is placed at a distance from the LED chip, can further enhance the light quality and reduce issues related to heat management and phosphor degradation.

Overall, the use of phosphor materials in LEDs to generate yellow and green light is a sophisticated process that significantly enhances the versatility and performance of LED lighting. By converting the initial light from the LED chip into a broader spectrum, phosphors enable the creation of lighting solutions that meet a wide range of optical parameters and application requirements. This technology continues to evolve, driving innovation and expanding the possibilities for LED lighting in various sectors.

Phosphor materials used to generate red light are crucial in achieving desired optical parameters for LED lighting applications, particularly for enhancing color rendering and creating warm white light. Red phosphors work by absorbing the light emitted from an LED chip, typically blue or UV, and re-emitting it at longer wavelengths corresponding to red light. This process, known as photoluminescence, allows the conversion of the initial high-energy light into the red part of the spectrum, which is essential for a broad range of lighting applications.

One of the commonly used red phosphors is europium-doped strontium thiogallate (SrGa2S4:Eu). This material efficiently converts blue or UV light into red light, providing a stable and high luminous output. Another widely used red phosphor is nitridosilicate, such as (Sr,Ca)AlSiN3:Eu2+, which is known for its excellent thermal stability and high conversion efficiency. These phosphors are designed to emit at specific wavelengths within the red spectrum, allowing for precise control over the color characteristics of the emitted light.

The integration of red phosphors with blue or UV LED chips is particularly important for creating high-quality white light. By combining red phosphors with yellow and green phosphors, manufacturers can produce LEDs with a high color rendering index (CRI) and a wide range of color temperatures. This combination enhances the overall quality of the light, making it more suitable for applications where accurate color representation is crucial, such as in retail lighting, museums, and residential lighting.

The distribution and thickness of the red phosphor layer play a critical role in the performance of the LED. A uniform application of the red phosphor ensures consistent light output and minimizes color variations. Additionally, the particle size and morphology of the phosphor material affect the scattering and absorption of light, influencing the overall efficiency and quality of the light emission. Advanced techniques such as remote phosphor placement can further optimize the light conversion process by reducing thermal quenching and improving light mixing.

The use of red phosphors also contributes to the development of tunable white LEDs, where the color temperature of the emitted light can be adjusted dynamically. By varying the intensity of the blue LED chip and the proportion of red phosphor, it is possible to create a range of white light from cool to warm. This tunability is valuable for applications requiring adaptable lighting environments, such as smart home systems and dynamic architectural lighting.

In summary, red phosphors are essential for enhancing the color quality and versatility of LED lighting. By converting blue or UV light into red light, these materials enable the creation of high-CRI, warm white LEDs that meet diverse lighting requirements. The ongoing development and optimization of red phosphor materials continue to expand the capabilities of LED technology, driving innovation and improving the performance and applicability of LED lighting solutions across various industries.

Adjusting the surface of the fluorescent layer to control light direction is a sophisticated technique used to enhance the performance and versatility of LED lighting devices. This process involves modifying the surface texture and structure of the phosphor layer to influence the scattering, reflection, and refraction of emitted light. By carefully designing the surface properties, manufacturers can achieve precise control over the light distribution, improving the efficiency and functionality of the lighting device.

In some embodiments, to adjust the surface of the fluorescent layer is through the use of micro- and nano-scale texturing. By creating a patterned surface with features such as grooves, ridges, or micro-lenses, it is possible to direct the light in specific directions. These surface structures can be designed to scatter light more uniformly, reduce glare, or enhance the focus of the light beam. The precise arrangement and dimensions of these features are critical for achieving the desired optical effects, and advanced fabrication techniques, such as photolithography or nanoimprinting, are often employed to create these intricate patterns.

Another approach to adjusting the light direction involves the incorporation of reflective or refractive coatings on the surface of the phosphor layer. Reflective coatings, such as dielectric mirrors or metallic films, can be applied to certain areas of the phosphor surface to redirect light towards specific angles or regions. Refractive coatings, such as graded-index materials, can be used to bend the light paths and control the beam shape. These coatings can be applied using various deposition techniques, including sputtering, evaporation, or chemical vapor deposition, allowing for precise control over the coating thickness and uniformity.

The surface roughness of the phosphor layer also plays a significant role in light direction control. A smoother surface tends to reflect light more specularly, while a rougher surface causes more diffuse scattering. By adjusting the surface roughness through polishing, etching, or other mechanical processes, it is possible to fine-tune the light distribution. For example, a matte surface finish may be desirable for creating a soft, diffused light, while a highly polished surface can enhance the brightness and focus of the light beam.

In addition to physical texturing and coatings, the use of composite materials in the phosphor layer can further enhance light direction control. By embedding scattering particles or micro-optical elements within the phosphor matrix, it is possible to influence the light paths at a microscopic level. These composite structures can be engineered to provide specific optical properties, such as increased light extraction efficiency or tailored angular distribution. Advanced materials science and engineering techniques are crucial for developing these complex composites and ensuring their stability and performance in LED devices.

Overall, adjusting the surface of the fluorescent layer to control light direction is a key aspect of modern LED technology. By leveraging various surface modification techniques, including texturing, coating, roughness adjustment, and composite material integration, manufacturers can achieve precise control over the light output. This capability allows for the creation of highly efficient and versatile lighting solutions that meet the diverse needs of contemporary applications, from residential and commercial lighting to specialized industrial and scientific uses. The continued advancement in surface modification technologies promises to further enhance the performance and adaptability of LED lighting in the future.

Flexible filament-style LEDs are gaining widespread popularity in the lighting industry due to their unique combination of aesthetic appeal and practical functionality. These LEDs mimic the appearance of traditional incandescent filaments, offering a vintage, nostalgic look while benefiting from the energy efficiency and longevity of modern LED technology. This blend of classic design and advanced performance makes flexible filament LEDs an attractive choice for a variety of lighting applications, from residential to commercial and decorative uses.

One of the key advantages of flexible filament-style LEDs is their versatility in design. The flexible nature of the filaments allows them to be shaped into various forms and configurations, enabling creative and innovative lighting solutions. Whether used in chandeliers, pendant lights, or custom fixtures, these LEDs can be tailored to fit specific design requirements, enhancing the aesthetic appeal of any space. This flexibility also makes them ideal for use in artistic and architectural lighting projects, where unique light patterns and shapes can significantly impact the overall ambiance and visual impact.

In addition to their design flexibility, flexible filament-style LEDs offer superior performance characteristics compared to traditional incandescent bulbs. They consume significantly less energy, resulting in lower electricity bills and reduced environmental impact. Their long lifespan means less frequent replacements, which is not only cost-effective but also more convenient for consumers. Furthermore, these LEDs generate less heat, making them safer to use in various settings, including enclosed fixtures and areas with limited ventilation. The combination of these benefits contributes to the growing popularity of flexible filament-style LEDs in the market.

The increasing adoption of flexible filament-style LEDs is also driven by the rising demand for sustainable and eco-friendly lighting solutions. As consumers become more environmentally conscious, there is a growing preference for products that minimize energy consumption and reduce carbon footprints. Flexible filament LEDs align with these values, offering an energy-efficient alternative that does not compromise on style or functionality. This shift towards greener lighting options is further supported by government regulations and incentives aimed at promoting energy-efficient technologies, making flexible filament-style LEDs an even more attractive choice for both consumers and businesses.

Furthermore, advancements in LED technology continue to enhance the performance and capabilities of flexible filament-style LEDs. Improvements in phosphor materials, manufacturing processes, and electronic components have led to better color rendering, higher luminous efficacy, and increased reliability. These technological developments ensure that flexible filament LEDs remain at the forefront of lighting innovation, providing high-quality illumination that meets the evolving needs of the market. As a result, they are becoming a preferred option for those seeking both aesthetic appeal and cutting-edge performance in their lighting solutions.

Overall, the popularity of flexible filament-style LEDs is a testament to their ability to combine the best aspects of traditional and modern lighting technologies. Their design flexibility, energy efficiency, long lifespan, and environmental benefits make them an ideal choice for a wide range of applications. As the lighting industry continues to evolve, flexible filament LEDs are poised to play a significant role in shaping the future of lighting, offering consumers innovative and sustainable options that enhance both the form and function of their spaces.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A lighting apparatus comprising:
a base plate;
multiple first type LED chips;
multiple second type LED chips;
a first fluorescent layer only covering the first type LED chips; and
a second fluorescent layer covering both the first type LED chips and the second type LED chips, wherein the first type LED chips integrated with the first fluorescent layer and the second fluorescent layer emit a first light, wherein the second type LED chips integrated with the second fluorescent layer emit a second light, wherein the first light and the second light has more than 30% overlapping, wherein a wall structure surrounds each of the first type LED chips for filling the first fluorescent layer to cover the first type LED chips.

2. The lighting apparatus of claim 1, wherein the first fluorescent layer engages the first type LED chips, wherein the second fluorescent layer covers the first fluorescent layer so that the first fluorescent layer is between the first type LED chips and the second fluorescent layer.

3. The lighting apparatus of claim 2, wherein a first surface region of the second fluorescent layer above the first type LED chips is taller than a second surface region of the second fluorescent layer above the second type LED chips.

4. The lighting apparatus of claim 2, wherein a first surface region of the second fluorescent layer above the first type LED chips has the same height as a second surface region of the second fluorescent layer above the second type LED chips.

5. The lighting apparatus of claim 1, wherein there is reflecting surface on a surrounding wall of the wall structure.

6. The lighting apparatus of claim 1, wherein the first fluorescent layer comprises yellow-green phosphor.

7. The lighting apparatus of claim 6, wherein the second fluorescent layer comprises red phosphor.

8. The lighting apparatus of claim 1, wherein the first type LED chips and the second type LED chips are arranged on the base plate in an interleaved pattern.

9. The lighting apparatus of claim 1, wherein the base plate is a flexible substrate.

10. The lighting apparatus of claim 1, wherein the base plate is a transparent substrate that allows more than 20% of light to pass through.

11. The lighting apparatus of claim 1, wherein there is a curvature surface on a top surface of the second fluorescent layer to guide the first light and the second light.

12. The lighting apparatus of claim 11, wherein the curvature surface is a convex surface to condense the first light and the second light.

13. The lighting apparatus of claim 11, wherein the curvature surface is a concave surface to diffuse the first light and the second light.

14. The lighting apparatus of claim 11, wherein there are multiple recessed areas with a diameter less than 1 mm distributed on surface of the second fluorescent layer.

15. The lighting apparatus of claim 1, wherein the concentration of phosphor material of the second fluorescent layer is larger on a bottom side near the second LED chips than a top side away from the second LED chips.

16. The lighting apparatus of claim 1, further comprising a third fluorescent layer attached on a back side of the base plate, wherein the first type LED chips and the second type LED chips are mounted on a front side of the substrate, wherein the front side and the back side are opposite of the substrates.

17. The lighting apparatus of claim 1, further comprising a driver coupled to a manual switch to receive a configuration indicator corresponding to the first type LED chips, the second type LED chips, the first fluorescent layer and the second fluorescent layer to determine driving currents corresponding to the first type LED chips and the second type LED chips.

18. The lighting apparatus of claim 1, wherein the second fluorescent layer has multiple fluorescent parts, wherein there are gaps between adjacent fluorescent parts for the base plate to bend.

19. The lighting apparatus of claim 1, wherein the first type LED chips are coupled on a first conductive path, wherein the second type LED chips are coupled on a second conductive path, wherein a driver respectively transmits a first driving current to the first conductive path and a transmits a second driving current to the second conductive path, wherein a ratio of the first driving current and the second driving current is adjustable to mix a required color temperature.

\* \* \* \* \*